United States Patent
Pandhumsoporn et al.

(10) Patent No.: US 7,351,664 B2
(45) Date of Patent: Apr. 1, 2008

(54) METHODS FOR MINIMIZING MASK UNDERCUTS AND NOTCHES FOR PLASMA PROCESSING SYSTEM

(75) Inventors: Tamarak Pandhumsoporn, Fremont, CA (US); Alferd Cofer, Fremont, CA (US); William Bosch, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/421,000

(22) Filed: May 30, 2006

(65) Prior Publication Data

US 2007/0281489 A1 Dec. 6, 2007

(51) Int. Cl.
*H01L 21/302* (2006.01)
*H01L 21/461* (2006.01)

(52) U.S. Cl. ............... 438/706; 438/694; 438/712
(58) Field of Classification Search ............... 438/706, 438/694, 712
See application file for complete search history.

(56) References Cited

U.S. PATENT DOCUMENTS

| | | | |
|---|---|---|---|
| 5,188,704 A | 2/1993 | Babie et al. | |
| 6,187,685 B1 | 2/2001 | Hopkins et al. | |
| 6,899,817 B1 | 5/2005 | Becker et al. | |
| 6,905,626 B2 | 6/2005 | Westerman et al. | |
| 6,905,737 B2 | 6/2005 | Verplancken et al. | |
| 6,905,969 B2 | 6/2005 | DeOrnellas et al. | |
| 6,926,844 B1 | 8/2005 | Laermer et al. | |
| 2003/0003748 A1* | 1/2003 | Khan et al. | 438/694 |
| 2005/0009358 A1* | 1/2005 | Choi et al. | 438/706 |
| 2005/0032386 A1* | 2/2005 | Chang et al. | 438/712 |
| 2007/0141847 A1 | 6/2007 | Pandhumsoporn et al. | |

* cited by examiner

*Primary Examiner*—Duy-Vu N. Deo
*Assistant Examiner*—Madmoud Dahimene
(74) *Attorney, Agent, or Firm*—IP Strategy Group, P.C.

(57) ABSTRACT

A method for etching silicon layer of a substrate, which is deposited on a bottom electrode in a plasma processing chamber. The method includes performing a main etch step until at least 70 percent of silicon layer is etched. The method further includes an overetch step, which includes a first, second, and third process steps. The first process step employs a first process recipe, the second process step employs a second process recipe, and the third process step employs a third process recipe. The second process recipe employs a second bottom bias voltage level applied to the bottom electrode which is higher than the first bottom bias voltage level employs in the first process recipe and the third bottom bias voltage level employs in the third process recipe. The first, second, and third process steps are alternated a plurality of times until silicon layer is etched through.

30 Claims, 9 Drawing Sheets

METHODS FOR MINIMIZING MASK UNDERCUTS AND NOTCHES FOR PLASMA PROCESSING SYSTEM

CROSS-REFERENCE TO RELATED APPLICATIONS

This application contains subject matter that is related to the subject matter of the following application, which is assigned to the same assignee as this application. The below-listed application is hereby incorporated herein by reference:

"Notch Stop Pulsing Process For Plasma Processing System," by Pandhumsopom et al., Ser. No. 11/305,440 filed on Dec. 16, 2005.

BACKGROUND OF THE INVENTION

Advances in plasma processing have provided for the growth in the semiconductor industry. With the utilization of a plasma processing system, substrates may be transformed into a variety of devices, such as a micro electromechanical system (MEMS) device. Substrate may be processed in a series of operations in which materials are deposited onto a substrate surface and selectively removed (etching) from predefined areas on the substrate surface in order to form trenches, vias, and other features thereon.

Consider the situation wherein, for example, a silicon substrate having an insulator layer and a silicon layer is being etched using fluorine-based gases such as $SF_6$, $NF_3$, and/or $CF_4$. The silicon layer may have a mask (such as a hard or resist mask) defining the areas available for etching. A trench may be formed during a vertical etch into the areas of the silicon layer not covered by the mask. As the silicon layer is being etched, lateral etching may unintentionally occur on either side of the sidewalls of the trench, causing one or more mask undercuts to be formed. As discussed herein, a mask undercut refers to a condition that occurs when a sidewall of a trench, vias, etc. is being undercut underneath a mask.

The aforementioned etching tends to slow down when an insulator layer is reached. One skilled in the art is aware that fluorine-based gases are less effective etchants of insulator layers, which may be a dielectric formed from organic and/or inorganic materials. Thus, when the fluorine-based etchant reaches the insulator layer, deeper lateral etching may occur at the intersection of the insulator layer and the silicon layer, causing notches to be formed in the sidewalls of the bottom trenches. As discussed herein, a notch refers to an undercut into the wall of the silicon layer near or at the insulator layer.

To facilitate discussion, FIG. 1 shows an example of a silicon substrate with mask undercuts and notches. A substrate 100 may include a silicon base layer 102. An insulator layer 104 is disposed below a silicon layer 106, which may be disposed below a mask layer 108. To etch silicon layer 106, a fluorine-based gas may be used to form a trench 110. As silicon layer 106 is being etched, lateral etching may occur on sidewalls 112 and 114 of trench 110 causing mask undercuts 116 and 118.

In addition, when insulator layer 104 is reached, fluorine-based gases may cause deeper lateral etching of sidewalls 112 and 114 of trench 110 to create notches 120 and 122 into silicon layer 106. As mentioned above, fluorine-based gas mixtures that are employed to etch silicon are less effective etchants of insulator layers, which may cause the fluorine-based gases to etch more of the sidewalls 112 and 114 of trench 110, causing notches to be formed in silicon layer 106.

Mask undercuts and notches are undesirable because both mask undercutting and notches may cause unreliability or yield loss in the final product, such as a micro electromechanical system (MEMS) device. Some manufacturing companies have attempted to control the impact of mask undercuts by increasing the size of the mask. By empirically determining the size of a mask undercut, manufacturing companies may be able to compensate for the mask undercut by increasing the size of the mask, resulting in a more quality device. However, a larger mask usually results in fewer devices being formed from a substrate, thus an increase in cost.

Other manufacturing companies have attempted to control mask undercuts and notches by employing a low frequency plasma systems. Although, mask undercuts and notches may occur in both high and low frequency plasma processing systems, those skilled in the arts are aware that lateral etching component may be more difficult to control in a high frequency plasma system, resulting in more and/or deeper mask undercuts and notches. In some examples, if notches undercut too much of the silicon layer, other device features may be compromised. In an example, notches 124 and 126 have joined together to create a breakthrough 128, which may result in a defective device. Consequently, some manufacturing companies have sacrificed such benefits as faster etcher via a high frequency plasma system, in order to gain control of the lateral etching component, by reverting back to low frequency plasma systems.

Since silicon semiconductor industry is a highly competitive market, manufacturing companies are seeking more viable solutions for resolving the mask undercut and notching issues.

SUMMARY OF INVENTION

The invention relates, in an embodiment, in a plasma processing chamber, to a method for etching a substrate having thereon a silicon layer. The plasma processing chamber has a bottom electrode and the substrate being disposed on the bottom electrode during the etching. The method includes performing a main etch step. The method also includes terminating the main etch step when a predefined etch depth into the silicon layer is achieved. The predefined etch depth is at least 70 percent of a thickness of the silicon layer. The method further includes performing an overetch step. The overetch step includes a first process step, a second process step, and a third process step. The first process step employs a first process recipe. The second process step employs a second process recipe. The third process step employs a third process recipe. The first process recipe is configured to perform using a first bottom bias voltage level applied to the bottom electrode. The second process recipe is configured to perform using a second bottom bias voltage level applied to the bottom electrode that is higher than the first bottom bias voltage level. The third process recipe is configured to perform using a third bottom bias voltage level applied to the bottom electrode that is lower than the second bottom bias voltage level. The first process step, the second process step, and the third process step are alternately performed a plurality of times. The method yet also includes terminating the overetch step after the silicon layer is etched through.

In another embodiment, the invention relates to, in a plasma processing chamber, a method for etching a substrate having thereon a silicon layer. The plasma processing chamber having a bottom electrode and the substrate is disposed on the bottom electrode during the etching. The method includes performing a main etch step. The method also includes terminating the main etch step when a predefined etch depth into the silicon layer is achieved. The predefined etch depth is at least 70 percent of a thickness of the silicon layer. The method further includes performing an overetch step. The overetch step includes a first process step, a second process step, and a third process step. The first process step employs a first process recipe. The second process step employs a second process recipe. The third process step employs a third process recipe. The second process recipe is configured to remove more silicon material from the silicon layer than either the first process recipe or the third process recipe. The first process step, the second process step, and the third process step are alternately performed a plurality of times. The method yet also includes terminating the overetch step after the silicon layer is etched through.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
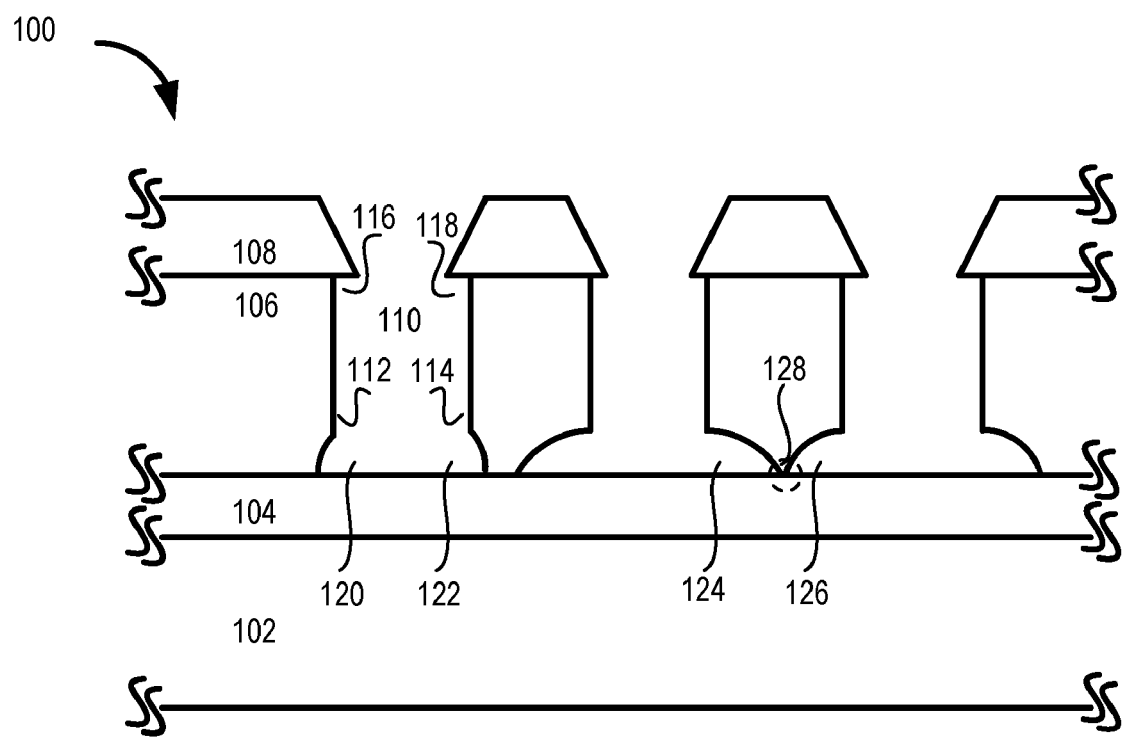
FIG. 1 shows an example of a silicon substrate with mask undercuts and notches.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the present invention, there is provided a method for processing substrates to form semiconductor devices in a plasma processing system. Embodiments of the invention relate to a critical dimension control process (CDCP) in which the etching process may be manipulated to substantially decrease the lateral etching component, resulting in a reduction in mask undercuts and notches.

In this document, various implementations may be discussed using a high frequency plasma system. This invention, however, is not limited to high frequency plasma system and may be employed in other plasma system, including a low frequency plasma system. As discussed herein, high frequency refers to a bottom RF frequency of 13.56 megahertz or higher. Also, as discussed herein, low frequency refers to a bottom RF frequency below 13.56 megahertz, more preferably approximately 50 kilohertz to about 900 kilohertz.

Also, in this document, various implementations may be discussed using a trench as an example of the type of pattern that may be etched on a substrate. This invention, however, is not limited to trenches and may be employed to etch other substrate patterns, includes vias.

Embodiments of the invention include a two plasma processing steps in etching silicon layer, a main etch step and an overetch step. In the main etch step, the silicon layer may be etched at a relatively fast etch rate. By etching at a quick rate, the amount of undercutting that may occur in the sidewalls of the silicon layer may be significantly reduced. Further, a more consistent etch may result from a faster etch rate.

The main etch step may include a number of intermediate substeps. In an embodiment, the main etch step may include an alternating first deposition substep and a first etch substep. In first deposition substep, a polymer-forming gas may be used, thereby causing passivation of the sidewalls and the horizontal surface. In the first etch substep, a fluorine-based gas may be used to etch the silicon layer. The first deposition and first etch substeps may be alternated with the removal rate of the first etch substep greater than the passivation rate of the first deposition step Once the threshold point (e.g., approximately the remaining 10 percent of silicon layer, in an embodiment) has been reached, the etching may be performed at a slower rate by switching from the main etch step to the overetch step. In an embodiment, the overetch step may include three substeps: a second deposition substep, a second etch substep, and a third deposition substep.

In the second deposition substep, polymer-forming gas mixture may be employed to deposit polymer at a first bottom bias voltage level for a pre-determined time period.

A second etching substep may then be performed, thereby causing the silicon layer to be etched at a second higher bottom bias voltage level at a pre-determined time period. In an embodiment, the gas mixture for the second etching substep may be any etchant, however, a fluorine-based gas mixture is preferable. Once the second etching substep has ended, the third deposition substep may be performed. In the third deposition substep, an oxygen-based gas mixture may be employed to oxidize the silicon and form a thin SiOx on the silicon layer at a third bottom bias voltage level for a pre-determined time period. The three substeps are alternated with the bottom bias voltage level for the second etching substep being greater than the bottom bias voltage level for the second deposition substep. In the prior art, the second etching substep and the third deposition substep may be combined. However, by separating the etching and the oxidation steps, better control may be provided over the lateral etching component.

Figure 2:
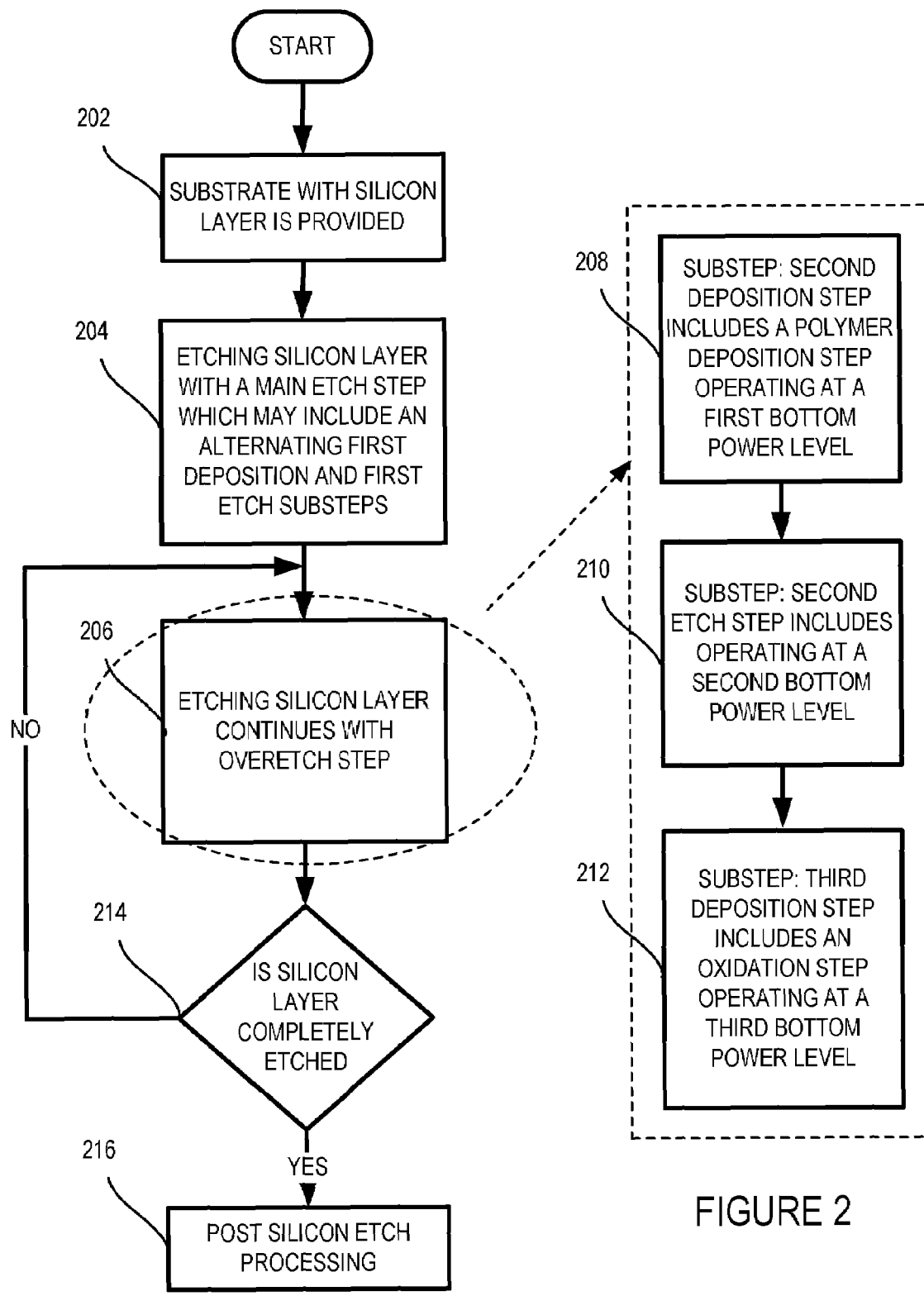
FIG. 2 shows, in an embodiment, a simple flowchart diagramming steps for a critical dimension control process (CDCP).

The features and advantages of embodiments of the invention may be better understood with reference to the figures and discussions that follow. FIG. 2 shows, in an embodiment, a simple flowchart diagramming steps for a critical dimension control process (CDCP). FIG. 2 is discussed in relation to FIGS. 3, 4, 5, 6, 7, 8A and 8B. A CDCP may be used to etch a silicon layer of a substrate. The substrate may be disposed above a bottom electrode in a plasma processing chamber. At a first step 202, a substrate with a silicon layer is provided. The silicon layer may be disposed above an insulator layer. In an embodiment, the CDCP may include a two step process: a main etch step and an overetch step.

Figure 3:
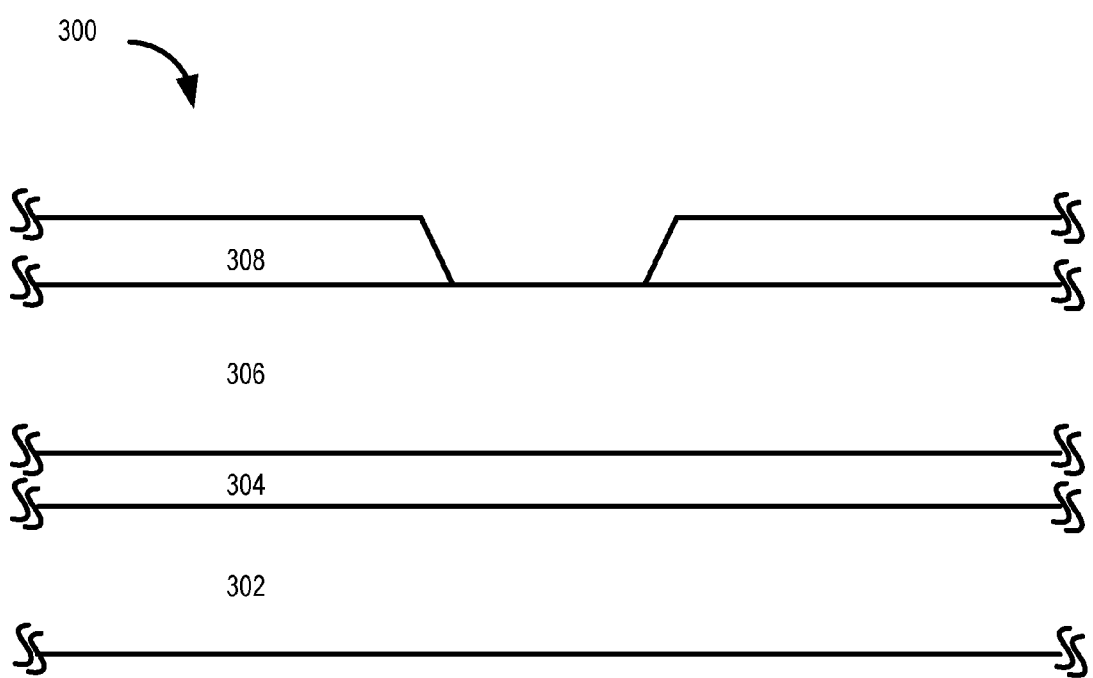
FIG. 3 shows, in an embodiment, a simple diagram of an example of a silicon substrate prior to being processes being processes in a plasma processing system.

FIG. 3 shows, in an embodiment, a simple diagram of an example of a silicon substrate, prior to being processed in a plasma processing system, such as a LAM 9400 DSiE™ system available from Lam Research Corporation of Fremont, Calif. A silicon substrate 300 may include a silicon base layer 302, an insulator layer 304, a silicon layer 306, and a mask 308. In an embodiment, mask 308 may include, but is not limited to a hard mask and a resist mask. Silicon layer 306, such as polysilicon, epitaxial silicon, and monocrystalline, may be of varying thickness depending upon device requirement. The trenches formed in silicon layer 306 over insulator layer 304 may be etched to form device structures above silicon substrate 302. Insulator layer 304 may be a dielectric formed from organic and/or inorganic materials. Insulator layer 304 may also be utilized to prevent undesirable etching of substrate base layer 302.

Referring back to FIG. 2, at a next step 204, etching silicon layer may begin with a main etch step. In an embodiment, main etch step 204 may include etching silicon layer 306 to an approximate depth toward insulator layer 304. Also, main etch step 204 may include a first process recipe to perform substantially vertical etch on a considerable portion of silicon layer 306. Since the thickness of the silicon material is generally known, a threshold point that triggers the overetch step of CDCP may occur at an empirically determined-depth. Etching that may occur in main etch step 204 may be considered a fast etch since silicon layer 306 may be etched at a quicker aggregate rate than the aggregated etch rate of the overetch step, thus reducing mask undercuts and notches. When a greater percentage of silicon layer 306 is etched at a faster rate, a faster and more consistent etch process results. In an embodiment, test results have shown a fast etching rate may be applied to a preferred range of about 70-95 percent, with a more preferred range of about 80-92 percent, and preferably at about 90 percent of the silicon layer.

Figure 4:
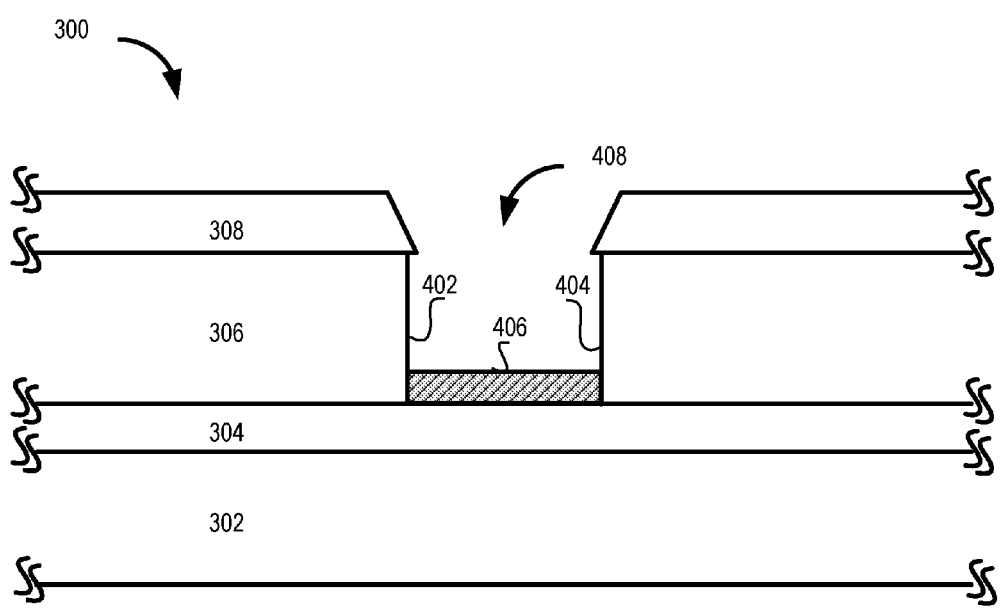
FIG. 4 shows, in an embodiment, a silicon substrate during a main etch step.

FIG. 4 shows, in an embodiment, a substrate during main etch step 204. Main etch step 204 may include any number of intermediate substeps. In an embodiment, main etch step 204 may be an alternating first deposition substep and first etch substep. In an embodiment, the gas mixtures employed during the first deposition substep may differ from the gas mixtures employed during the first etch substep. In the first deposition substep, a polymer-forming gas may be utilized, allowing passivation of sidewalls 402 and 404 of trench 408. In the first etch substep, a fluorine-based gas may be utilized. Consider the situation wherein, for example, a silicon layer may be etched. In the first deposition substep, part of sidewalls (402 and 404) and horizontal surface 406 may be passivated using a polymer-forming gas such as $C_4F_8$. During the first etch substep, vertical etching of silicon layer may occur. Preferably, a fluorine-based gas, such as $SF_6$, may be employed as an etchant. These two substeps may be alternated with the removal rate of the first etch substep greater than the passivation rate of the first deposition substep until the threshold point (e.g., approximately the remaining 10 percent of silicon layer, in an embodiment) has been reached. In an embodiment, more than one process recipes may be used during the main etch step. A need for a plurality of process recipes during the main etch step may depend upon requirements of devices being created.

TABLE 1

Example of Main Etch Step Parameters

| Parameters | During 1st Deposition Substep | During 1st Etch Substep |
| --- | --- | --- |
| Top Power | 100 W to 5000 W | 100 W to 5000 W |
| Bottom Bias | 1 V to 2000 V | 1 V to 2000 V |
| Chamber Pressure | 5 millitorrs to 200 millitorrs | 5 millitorrs to 200 millitorrs |
| Gas Mixture | $C_4F_8$ | $SF_6$ |

Although parameter ranges may vary depending upon the type of devices and the plasma processing system that may be utilized, Table 1 above shows an example of some of the parameters for the first deposition substep and the first etch substep for a high frequency plasma system. In an embodiment, the main etch step may include more than one process recipe. In an example, the first etch substep may employ a process recipe that may be different than a process recipe employed by the first deposition substep. Note that process recipes for the main etch step may depend upon the type of substrate and plasma processing system that may be utilized.

In an example, top power for the process recipes for the first etch substep and/or the first deposition substep may be between about 100 W and about 5000 W, preferred range may be approximately 400 W to approximately 3000 W. One skilled in the art is aware that top power is usually used as a power source to generate plasma. Also, process recipes for the first etch substep and/or the first deposition substep may include ranges for a bottom bias voltage level, which may be employed to manipulate ions. Bottom bias voltage level applied to the bottom electrode may be selected between about 1 V to about 2000 V. In some embodiments, a preferred range may be doubled in a low frequency plasma system. As for chamber pressure, process recipes for the first etch substep and/or the first deposition substep may include a chamber pressure range of about 5 millitorrs to about 200 millitorrs. Preferably, chamber pressure may be at least 50 millitorrs. Further, although different type of gases may be utilized as an etchant, a fluorine-based gas mixture is preferred.

Once a threshold point has been reached, different process recipes may be applied during an overetch step of CDCP. Referring back to FIG. 2, at a next step 206, etching silicon layer may continue with an overetch step. In an embodiment, an overetching process may be used to limit lateral etching that may transpire. In an embodiment, overetch step 206 may include three substeps: a second deposition substep 208, a second etch substep 210, and a third deposition substep 212.

Figure 5:
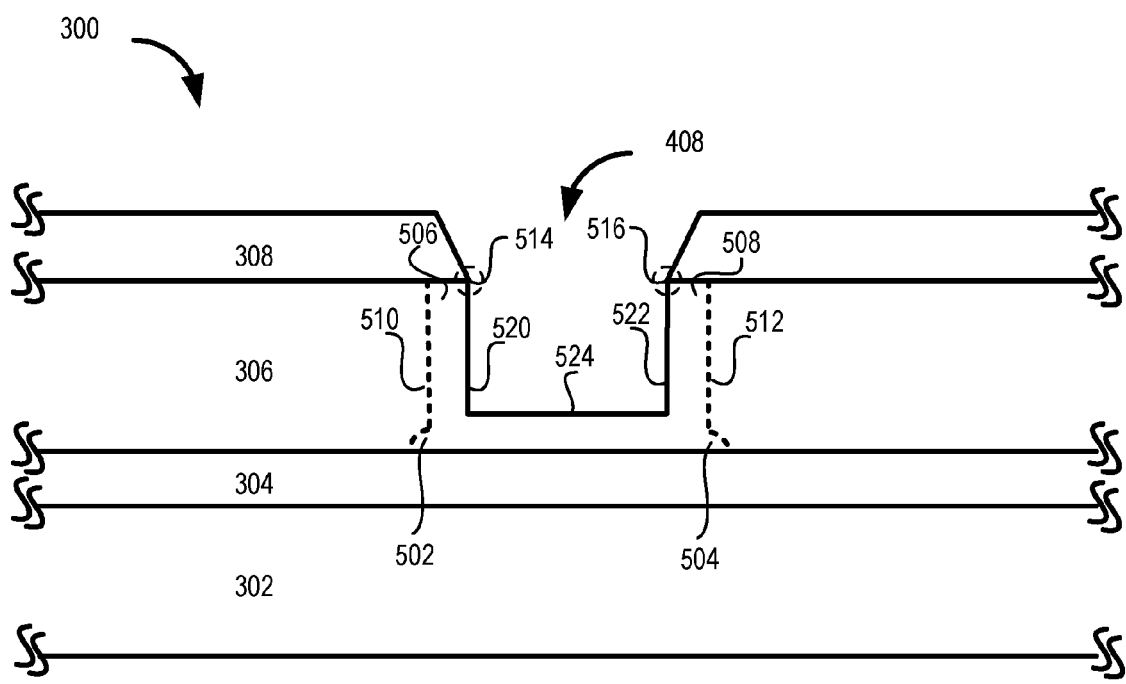
FIG. 5 shows, in an embodiment, a silicon substrate with a layer of a polymer-forming gas mixture.

At a next substep 208, a second deposition substep may include depositing a polymer using a polymer-forming gas mixture at a first bottom bias voltage level for a pre-determined time period. FIG. 5 shows, in an embodiment, silicon substrate 300 with a layer of a polymer deposited. Without a second deposition substep, continuing to etch silicon layer 306 near or at insulator layer 304 may cause lateral etching resulting in notches 502 and 504 and mask undercuts 506 and 508. To limit the lateral etching that may occur, a second deposition substep is employed. During the second deposition substep, a polymer-forming gas mixture such as $C_4F_8$ may be employed to deposit polymer on top of silicon layer 306 and within trench 408. This substep may enable the silicon layer to be rebuilt before the etching continues. Silicon layer 306 may be rebuilt by depositing a polymer into trench 408 and may create a new sidewall in trench 408. In an example, sidewalls 510 and 512 may be located at a distance inward from mask edges 514 and 516, resulting in undesirable mask undercuts 506 and 508. With the second deposition substep, sidewalls 510 and 512 may be rebuilt forming new sidewalls 520 and 522, which may be located at a closer proximity to mask edges 514 and 516, thus, reducing the size of mask undercuts 506 and 508. In addition, the second deposition substep may also result in horizontal surface 524 to be rebuilt.

Figure 6:
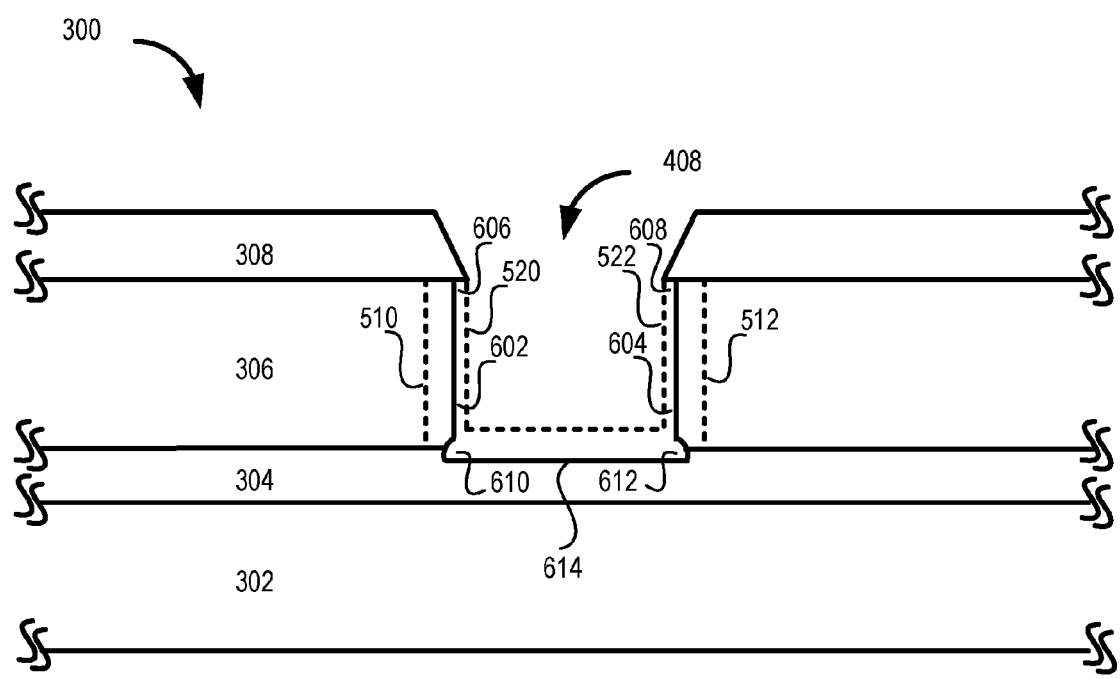
FIG. 6 shows, in an embodiment, a silicon substrate after a second etch substep.

At a next step 210, a second etch substep may include etching the silicon layer at a second higher bottom bias voltage level for a pre-determined time period. Although different type of gases may be used as an etchant, a fluorine-based gas such as $SF_6$ may be a more superior etchant for etching silicon layer than other gas mixtures (e.g., chlorine-based gases). FIG. 6 shows, in an embodiment, silicon substrate 300 after the second etch substep. Silicon layer 306 may be etched to form trench 408 with new sidewalls 602 and 604. Due to the lateral etching that may occur, mask undercuts 606 and 608 may be formed with sidewalls 602 and 604 located in proximity from mask edges 514 and 516. In an embodiment, sidewalls 602 and 604 may be located at a closer proximity to mask edges 514 and 516 than sidewalls 510 and 512. In another embodiment, sidewalls 602 and 604 may be located at a further distance from mask edges 514 and 516 than sidewalls 520 and 522. Lateral etching may also cause notches 610 and 612 to be formed. In an embodiment, the second etch substep may cause part of insulator layer 304 to be etched to form a horizontal surface 614.

Figure 7:
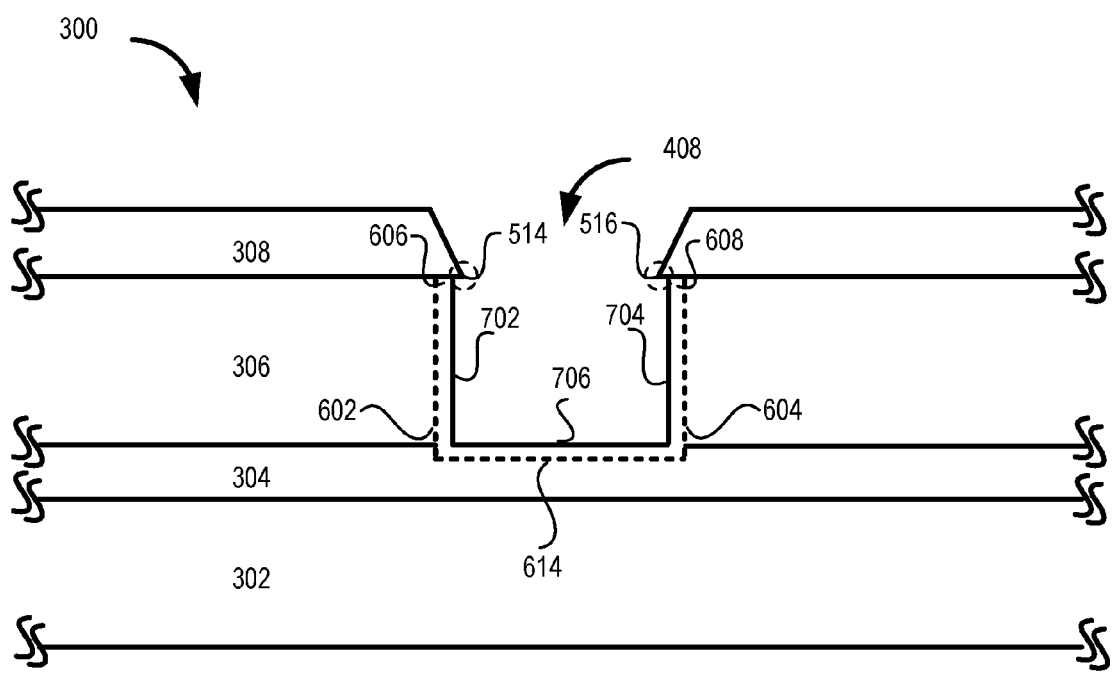
FIG. 7 shows, in an embodiment, silicon substrate with a layer of an oxygen-based gas mixture.

At a next substep 212, a third deposition substep may include an oxidation step operating at a lower third bottom bias voltage level for a pre-determined time period. In the third deposition substep, an oxygen-based gas such as $O_2$ may be employed to passivate the silicon sidewalls and to rebuild the horizontal surface of silicon layer 306. FIG. 7 shows, in an embodiment, silicon substrate 300 with an oxygen-based gas mixture. During the third deposition substep, an oxygen-based gas mixture such as $O_2$ may be employed to oxidize the silicon and form a thin SiOx horizontal layer 706. The third deposition substep may rebuild at least part of silicon layer 306 by forming SiOx horizontal layer 706, which may reduce the mask undercuts and the notches. Silicon layer 306 may be rebuilt by depositing an oxygen-based gas mixture into trench 408, which may create a new sidewall in trench 408. In an example, sidewalls 602 and 604 may be rebuilt to form new sidewalls 702 and 704, which may be located at a closer proximity to mask edges 514 and 516, thus, reducing the size of mask undercuts 606 and 608. In addition, the third deposition substep may also result in horizontal surface 614 to be rebuilt to a new SiOx horizontal level 706.

TABLE 2

Example of Overetch Step Parameters

| Parameters | During 2nd Deposition Substep | During 2nd Etch Substep | During 3rd Deposition Substep |
| --- | --- | --- | --- |
| Top Power | 100 W to 3000 W | 100 W to 3000 W | 100 W to 3000 W |
| Bottom Bias | 0 V to −300 V | 0 V to −300 V | 0 V to −300 V |
| Chamber Pressure | 1 millitorrs to 200 millitorrs | 1 millitorrs to 200 millitorrs | 1 millitorrs to 200 millitorrs |
| Gas Mixture | C4F8 | $SF_6$ | $O_2$ |
| RF Frequency for high frequency machine | 13.56 megahertz | 13.56 megahertz | 13.56 megahertz |
| RF Frequency for low frequency machine | 50 kilohertz-900 kilohertz | 50 kilohertz-900 kilohertz | 50 kilohertz-900 kilohertz |

Although parameters ranges may vary depending upon the type of devices and the plasma processing system that may be utilized, Table 2 above, shows an example of some of the parameters for the second deposition substep, the second etch substep, and the third deposition substep in a high frequency plasma system. In an embodiment, the overetch step may include more than one process recipe. In an example, the process recipe for the second deposition substep may be different than the process recipe for the second etch substep and the process recipe for the third deposition substep. Similar to process recipes for the main etch step, process recipes for the overetch step may depend upon the type of substrate and device that may be desired.

Process recipes for the overetch step may include a top power and chamber pressure, which may be similar to a main etch step. Also, the top power for the process recipes of the overetch step may be constant. In an embodiment, preferred range for top power may vary depending upon the etching rate. If a fast etching rate is desired, preferred range for top power may be about 800 W to about 3000 W. If etching is performed at a slower rate, than preferred range for top power may be about 200 W to about 1000 W.

However, the bottom bias voltages and gas mixtures for the process recipes for the overetch step may vary depending upon the substeps. By controlling the gas mixtures and/or the bottom bias voltage levels that may be applied to the bottom electrode at each substep of the overetch step, the lateral etching component may be controlled; thus, mask undercut and/or notching may be substantially reduced or eliminated during processing of the silicon layer.

Different gas mixtures may be utilized during each alternating overetch substeps. Not only may the gas mixtures differ between overetch substeps, but the gas mixtures may also be different for an overetch substep during each alternating cycle, depending upon requirements of devices being created. In an example, during the first cycle, the gas mixture that may be used during the oxidizing step may be $O_2$; however, during the second cycle, the gas mixture that may be employed may be $O_2$ or other oxygen containing gas mixtures.

By controlling bottom bias voltage level applied to the bottom electrode at each substep of the overetch step, the lateral etching component may be controlled; thus, mask undercut and/or notching may be substantially reduced or eliminated during processing of the silicon layer. Process recipes for the overetch step may include a much lower bottom bias voltage range than that of a main etch step. By reducing the bottom bias voltage level, etching rate may be significantly reduced to enable a more controlled and precise etching of the remaining silicon layer.

TABLE 3

Voltage Ranges for Bottom Bias Level During Overetch Step

| Parameters | During $2^{nd}$ Deposition Substep | During $2^{nd}$ Etch Substep | During $3^{rd}$ Deposition Substep |
| --- | --- | --- | --- |
| Preferred Range | −30 V to −300 V | 0 V to −300 V | 0 V to −300 V |
| More Preferred Range | −30 V to −200 V | −50 V to −250 V | 0 V to −250 V |

Although voltage ranges for bottom bias level may vary depending upon the type of devices and the plasma processing system that may be utilized, Table 3 above, shows some examples of bottom bias voltage ranges during the second deposition substep, the second etch substep, and the third deposition substep. The preferred range for the second deposition substep may be about −30 V to about −300 V with a more preferred range of about −30 V to about −200 V. The preferred range for bottom bias during the second etch substep may be about 0 V to about −300 V, with a more preferred range for bottom bias of about −50 V to about −250 V. Likewise, the preferred range for the third deposition substep may be about 0 V to about −300 V, with a more preferred range of about 0 V to about −250 V.

Although time ranges for bottom bias voltage level may vary depending upon the type of devices and the plasma processing system that may be utilized, Table 4 above, shows some examples of time ranges for bottom bias voltage level of a high frequency plasma system. Time ranges during the second deposition step may preferably be between about 0.5 second and about 5 second, more preferably between about 0.5 second and about 4 seconds, and preferably at about 0.5 second. Time ranges for the second etch substep may preferably be between about 0.5 second and about 5 seconds, more preferably between about 0.5 second and about 4 seconds, and preferably at about 0.5 second. In the third deposition substep, time ranges may preferably be between about 0.5 second and about 5 seconds, more preferable between about 0.5 second and about 4 second, and preferably at about 0.5 second.

Overetch step may include alternating the RF bottom bias at different power levels during each cycle. Time duration for each substep may vary depending upon the duty cycle. Consider the situation wherein, for example, the duty cycle is 25 percent for the second deposition substep, 50 percent for the second etch substep, and 25 percent for the third deposition substep. In this example, the second etch substep is twice as long as the first or third deposition substep.

As bottom bias voltage levels alternate between higher and lower levels, the bottom bias voltage level may be altered during each cycle. In an example, during a first cycle, the process recipe may call for a bottom bias level at the second deposition step to be at 0 V. At a next cycle, the process recipe may require bottom bias level at second deposition step to be increased to 2 V. Complexity of process recipe may depend upon requirements of device being created and capability of plasma processing system being utilized.

Figure 8A:
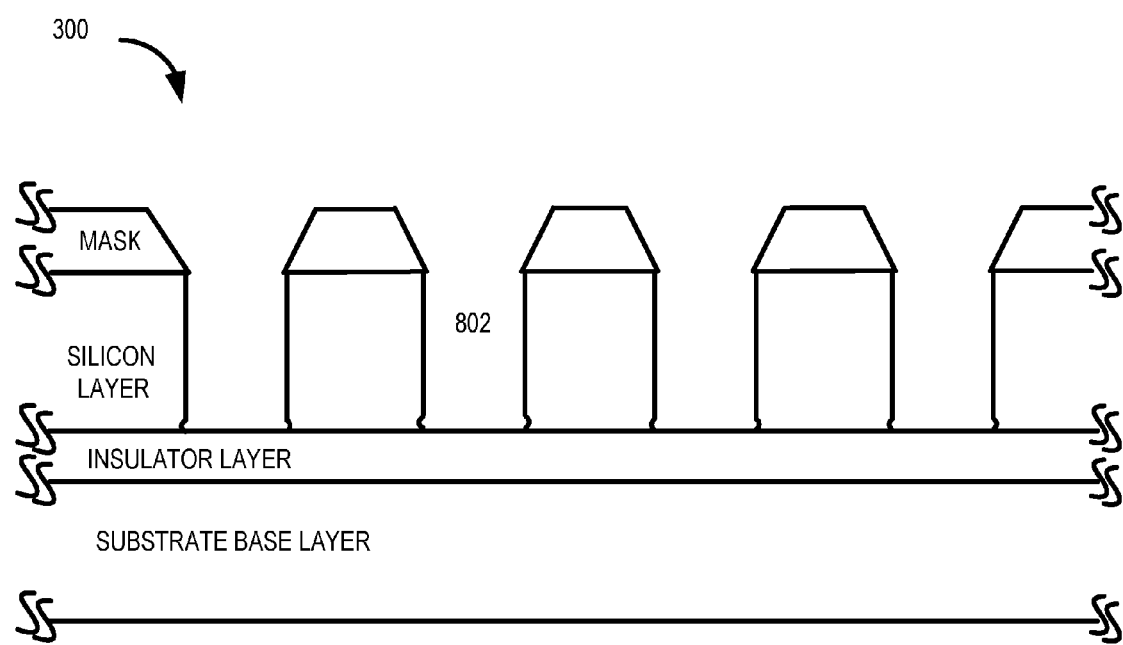
FIG. 8A shows, in an embodiment, a silicon substrate after CDCP with the mask undercuts and notches being significantly reduced.
Figure 8B:
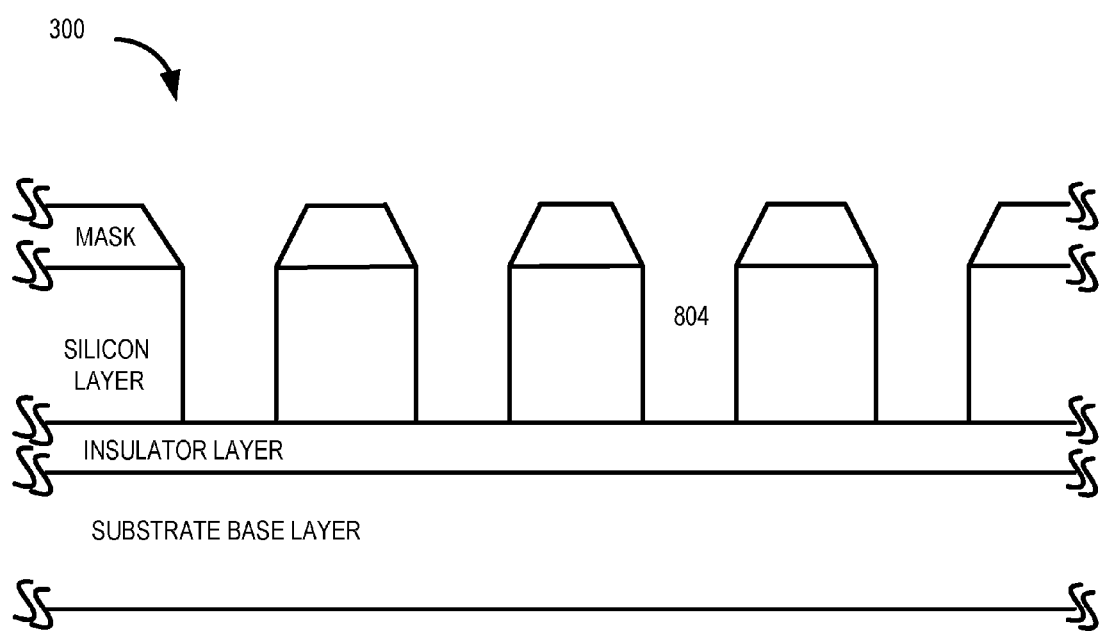
FIG. 8B shows, in an embodiment, a silicon substrate after CDCP with the mask undercuts and notches being substantially eliminated.

At a next step 214, the method determines whether a silicon layer is completely etched. If a silicon layer is not completely etched, the method returns to step 206 to continue etching silicon layer. By alternating between the second deposition substep, the second etch substep, and the third deposition substep, the remaining thickness of the silicon layer may be etched with mask undercut and notching being substantially reduced or eliminated. Terminating the overetch step may be determined using an optical emission endpoint method, for example, or another endpoint method. If the silicon layer is completely etched, the method continues to post silicon etch processing at a next step 216. FIGS. 8A and 8B shows, in various embodiment, a silicon layer of a substrate after CDCP with the mask undercuts and notches being either significantly reduced (trench 802 of FIG. 8A) or substantially eliminated (trench 804 of FIG. 8B).

As can be appreciated from the embodiments of the invention, CDCP provides for an effective method of con-

TABLE 4

Time Ranges for Bottom Bias Level

| Parameters | During $2^{nd}$ Deposition Substep | During $2^{nd}$ Etch Substep | During $3^{rd}$ Deposition Substep |
| --- | --- | --- | --- |
| Preferred Range | 0.5 second to 5 seconds | 0.5 second to 5 seconds | 0.5 second to 5 seconds |
| More Preferred Range | 0.5 second to 4 seconds | 0.5 second to 4 seconds | 0.5 second to 4 seconds |
| At time | 0.5 second | 0.5 second | 0.5 second |
| Duty Cycle | 0 to 90% | 0 to 90% | 0 to 90% | trolling lateral etching that may occur, thereby significantly shrinking the size of mask undercuts and notches that tend to occur during etching of silicon layer. By reducing mask undercuts and notches, the number of quality devices that may be generated from a substrate may increase, resulting in less waste and reduced manufacturing cost. With CDCP, manufacturing companies may continue to utilize the benefits of a high frequency plasma processing system, without compromising control of lateral etching component. Further, as CDCP does not require hardware changes, manufacturing companies may appreciate significant financial benefits gained from a reduction in the number of defective devices created.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention. In the following claims, the terms "first", "second", "third", "fourth", "fifth", and other sequential terminology are employed for labeling purposes to improve clarity of understanding and do not necessarily imply or define a chronological sequence or a logical sequence.

What is claimed is:

1. In a plasma processing chamber, a method for etching a substrate having thereon a silicon layer, said plasma processing chamber having a bottom electrode, said substrate being disposed on said bottom electrode during said etching, comprising:
performing a main etch step;
terminating said main etch step when a predefined etch depth into said silicon layer is achieved, said predefined etch depth being at least 70 percent of a thickness of said silicon layer and being at most 95 percent of said thickness of said silicon layer;
performing an overetch step, said overetch step including a first process step, a second process step, and a third process step, said first process step employing a first process recipe, said second process step employing a second process recipe, said third process step employing a third process recipe, said first process recipe including a first gas mixture and being configured to perform using a first bottom bias voltage level applied to said bottom electrode, said second process recipe including a second gas mixture and being configured to perform using a second bottom bias voltage level applied to said bottom electrode that is higher than said first bottom bias voltage level, said third process recipe including a third gas mixture and being configured to perform using a third bottom bias voltage level applied to said bottom electrode that is lower than said second bottom bias voltage level, wherein said first process step, said second process step, and said third process step are alternately performed a plurality of times, and wherein said first gas mixture, said second gas mixture, and said third gas mixture are different; and
terminating said overetch step after said silicon layer is etched through.

2. The method of claim 1 wherein said second process recipe is configured to remove more silicon material from said silicon layer than said first process recipe employed by said first process step and said third process recipe employed by said third process step.

3. The method of claim 1 wherein said first process recipe includes using a polymer-forming gas.

4. The method of claim 1 wherein said second process recipe includes using a fluorine-based gas.

5. The method of claim 1 wherein said third process recipe includes using an oxygen-based gas.

6. The method of claim 1 wherein said polymer-forming gas includes $C_4F_8$.

7. The method of claim 1 wherein said fluorine-based gas includes $SF_6$.

8. The method of claim 1 wherein said oxygen-based gas includes $O_2$.

9. The method of claim 1 wherein said main etch step includes a first process step of said main etch step and a second process step of said main etch step, said first process step of said main etch step employing a first process recipe for said main etch step that is configured to remove more silicon material from said silicon layer than a second process recipe for said main etch step employed by said second process step of said main etch step, said first process recipe for said main etch step employing a gas mixture that is different from a gas mixture employed during said second process step of said main etch step.

10. The method of claim 1 wherein said predefined etch depth is at least 80 percent of said thickness of said silicon layer.

11. The method of claim 1 wherein said predefined etch depth is at least 90 percent of said thickness of said silicon layer.

12. The method of claim 1 wherein a first duration of said first process step is substantially the same as a second duration of said second process step and a third duration of said third process step.

13. The method of claim 1 wherein said first duration of said first process step is different than either said second duration of said second process step or said third duration of said third process step.

14. The method of claim 1 wherein said first process step, said second process step and said third process step last between about 0.5 second and about 5 seconds.

15. The method of claim 1 wherein said terminating said overetch step is determined using an optical emission endpoint method.

16. In a plasma processing chamber, a method for etching a substrate having thereon a silicon layer, said plasma processing chamber having a bottom electrode, said substrate being disposed on said bottom electrode during said etching, comprising:
performing a main etch step;
terminating said main etch step when a predefined etch depth into said silicon layer is achieved, said predefined etch depth being at least 70 percent of a thickness of said silicon layer and being at most 95 percent of said thickness of said silicon layer;
performing an overetch step, said overetch step including a first process step, a second process step, and a third process step, said first process step employing a first process recipe that includes a first gas mixture, said second process step employing a second process recipe that includes a second gas mixture, said third process step employing a third process recipe that includes a third gas mixture, said second process recipe being configured to remove more silicon material from said silicon layer than either said first process recipe and said third process recipe, wherein said first process step, said second process step, and said third process step are alternately performed a plurality of times, and wherein said first gas mixture, said second gas mixture, and said third gas mixture are different; and terminating said overetch step after said silicon layer is etched through.

17. The method of claim 16 wherein said first process recipe includes using a polymer-forming gas.

18. The method of claim 16 wherein said second process recipe includes using a fluorine-based gas.

19. The method of claim 16 wherein said third process recipe includes using an oxygen-based gas.

20. The method of claim 16 wherein said polymer-forming gas includes $C_4F_8$.

21. The method of claim 16 wherein said fluorine-based gas includes $SF_6$.

22. The method of claim 16 wherein said oxygen-based gas includes $O_2$.

23. The method of claim 16 wherein said first process step is being performed using a first bottom bias voltage level applied to said bottom electrode, said second process step is being performed using a second bottom bias voltage level applied to said bottom electrode that is higher than said first bottom bias voltage level, and said third process step is being performed using a third bottom bias voltage level applied to said bottom electrode that is lower than said second bottom bias voltage level.

24. The method of claim 16 wherein said main etch step includes a first process step of said main etch step and a second process step of said main etch step, said first process step of said main etch step employing a first process recipe for said main etch step that is configured to remove more silicon material from said silicon layer than a second process recipe for said main etch step employed by said second process step of said main etch step, said first process recipe for said main etch step employing a gas mixture that is different from a gas mixture employed during said second process step of said main etch step.

25. The method of claim 16 wherein said predefined etch depth is at least 80 percent of said thickness of said silicon layer.

26. The method of claim 16 wherein said predefined etch depth is at least 90 percent of said thickness of said silicon layer.

27. The method of claim 16 wherein a first duration of said first process step is substantially the same as a second duration of said second process step or a third duration of said third process step.

28. The method of claim 16 wherein said first duration of said first process step is different than either said second duration of said second process step and said third duration of said third process step.

29. The method of claim 16 wherein said first process step, said second process step, and said third process step last between about 0.5 second and about 5 seconds.

30. The method of claim 16 wherein said terminating said overetch step is determined using an optical emission endpoint method.

* * * * *